(12) United States Patent
Robinson et al.

(10) Patent No.: US 6,982,593 B2
(45) Date of Patent: Jan. 3, 2006

(54) SWITCHING AMPLIFIER ARCHITECTURE (75) Inventors: Ian Robinson, Venice, CA (US); Frank Winter, San Diego, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 22 days.

(21) Appl. No.: 10/691,987

(22) Filed: Oct. 23, 2003

(65) Prior Publication Data

US 2005/0088226 A1    Apr. 28, 2005

(51) Int. Cl.
  *H03F 3/38*  (2006.01)
  *H03G 3/20*  (2006.01)
(52) U.S. Cl. .................. 330/10; 330/136; 330/297
(58) Field of Classification Search ............... 330/10, 330/124 R, 136, 149, 297
  See application file for complete search history.

(56) References Cited

U.S. PATENT DOCUMENTS

| | | | |
|---|---|---|---|
| 6,472,934 B1 | 10/2002 | Pehlke | |
| 6,529,716 B1 | 3/2003 | Eidson et al. | |
| 2002/0090920 A1 | 7/2002 | McCune | |
| 2004/0263245 A1 * | 12/2004 | Winter et al. | ............ 330/10 |

FOREIGN PATENT DOCUMENTS

EP    1 492 229 A1    12/2004

OTHER PUBLICATIONS

Stapleton, et al., "High Efficiency RF Power Amplifiers Using Bandpass Delta-Sigma Modulators", p. 1-22.

European Search Report for EP 04 02 5039, completed Jul. 8, 2005 by Examiner T. Agerbaek in Munich.

Zhao, et al. Institute of Eletrical and Electronics Engineers: "*Doherty Amplifier with DSP Control to Improve Performance in CDMA Operation*", 2003 IEEE MTT-S International Microwave Symposium Digest. (IMS 2003). Philadelphia, PA, Jun. 8-13, 2003, IEEE MTT-S International Microwave Symposium, New York, NY: IEEE, US, vol. 3 of 3, Jun. 8, 2003, pp. 687-690, XP010645001, ISBN 0-7803-7695-1 *figure 4*.

* cited by examiner

*Primary Examiner*—Steven J. Mottola
(74) *Attorney, Agent, or Firm*—Tarolli, Sundheim, Covell & Tummino L.L.P.

(57) ABSTRACT

A supply voltage and/or bias of a switching amplifier is modified based on at least one characteristic of the input signal relative to a threshold level. A binary waveform converter converts the input signal into a binary waveform for inputting into the switching amplifier. The switching amplifier amplifies the input signal, while the supply voltage and/or bias is modified in response to changes of the at least one characteristic of the input signal.

33 Claims, 6 Drawing Sheets

SWITCHING AMPLIFIER ARCHITECTURE

TECHNICAL FIELD

The present invention relates generally to electronic devices, and more particularly to a switching amplifier architecture.

BACKGROUND OF THE INVENTION

Modern transmitters for applications such as cellular, personal, and satellite communications employ digital modulation techniques such as quadrature phase-shift keying (QPSK) in combination with code division multiple access (CDMA) communication. Shaping of the data pulses mitigates out-of-band emissions from occurring into adjacent channels but produces time-varying envelopes. In addition to amplifying individual waveforms with time varying envelopes, many transmitters (especially in base stations) are being configured to amplify multiple carriers. Multi-carrier signals have high a wide distribution of power levels resulting in a large peak-to-average ratio (PAR). Therefore, the operation of amplifiers (e.g., linear amplifiers) in these types of signals is very inefficient, since the amplifiers must have their supply voltage sized to handle the large peak voltages even though the signals are much smaller a substantial portion of the time. Additionally, the size and cost of the power amplifier is generally proportional to the required peak output power of the amplifier.

Wideband Code Division Multiple Access (WCDMA), Orthogonal Frequency Division Multiplexing (OFDM), and multi-carrier versions of Global Standard for Mobile Communication (GSM) and Code Division Multiple Access 2000 (CDMA 2000) are wireless standards and applications growing in use. Each requires amplification of a waveform with high PAR levels, above 10 dB in some cases. The sparse amount of spectrum allocated to terrestrial wireless communication requires that transmissions minimize out-of-band (OOB) emissions to minimize the interference environment. A linear amplifier used to amplify a waveform with a PAR of 10 dB or more provides only 5–10% DC-RF efficiency. The peak output power for the amplifier is sized by the peak waveform. The cost of the amplifier scales with its, peak power. Several other circuit costs including heat sinks and DC-DC power supplies scale inversely to peak power and dissipated heat (which results from the electrical inefficiency). Related base station costs of AC-DC power supplies, back-up batteries, cooling, and circuit breakers also scale inversely with efficiency as does the electrical operating costs. Clearly, improving DC-RF efficiency is a major cost saver both for manufacture and operation.

Switching amplifiers (e.g., Class C, D, or S type amplifiers) amplifiers switch between and "ON" and an "OFF" state nominally only using quiescent power during the transitions between "ON" and "OFF". Their efficiency is very high when amplifying signals with a binary format, in response to a pulse width modulated signal that drives the transistors of the switching amplifier, or to carefully limited/clamped signals. Switching amplifiers are more efficient than linear classes of operation such as Class-A, Class-AB or Class-B type which conduct during at least half of the RF cycle and are significantly backed off from compression. Switching amplifiers provide very high (>70% and as high as 95%) efficiency when driven with constant envelope binary signals resembling square waves. However, switching amplifiers do not maintain high efficiency for signals with non-constant envelopes. Additionally, switching amplifier efficiency degrades as signal levels fall substantially below the supply voltage of the switching amplifier.

SUMMARY OF THE INVENTION

The present invention relates to a switching amplifier architecture. In one aspect of the invention, the switching amplifier architecture includes a switching amplifier operative to amplify an input signal. The switching amplifier architecture includes a supply control device that varies a supply voltage of the switching amplifier based on a characteristic of the input signal relative to a threshold level. A binary waveform converter converts the input signal into a binary waveform for inputting into the switching amplifier.

In another aspect of the invention, a system is provided for amplifying a signal that includes a binary waveform converter that converts an n-bit word representing an input signal into a binary waveform. A digital-to-analog converter (DAC) converts the binary waveform into an analog binary waveform, and a switching amplifier amplifies the analog binary waveform. A digital control device modifies a configuration of the system in response to changes in at least one characteristic associated with the input signal. The modification of the configuration can include adjusting the supply and/or bias of the switching amplifier. Alternatively, the modification of the configuration can include switching between providing an analog binary waveform to the inputs of the switching amplifier and a main amplifier for peak level signals, and providing a constant signal to the input of the switching amplifier with the analog binary waveform being provided to the input of the main amplifier for average level signals.

Another aspect of the invention relates to a method of amplifying an input signal with a switching amplifier. The method includes determining a supply level adjustment profile based on changes in at least one characteristic associated with an input signal. The input signal is then converted into a single bit binary waveform, and the single bit binary waveform is converted into an analog binary waveform. The analog binary waveform is provided to a switching amplifier which provides an amplified output signal, while concurrently adjusting a supply and/or bias level of the switching amplifier based on the supply level adjustment profile.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

DETAILED DESCRIPTION OF INVENTION

The present invention relates to a switching amplifier architecture. A supply voltage and/or bias of a switching amplifier is modified based on at least one characteristic of the input signal relative to a threshold level. A binary waveform converter converts the input signal into a binary waveform for inputting into the switching amplifier. The switching amplifier amplifies the input signal, while the supply voltage and/or bias is modified in response to changes of the at least one characteristic of the input signal.

Figure 1:
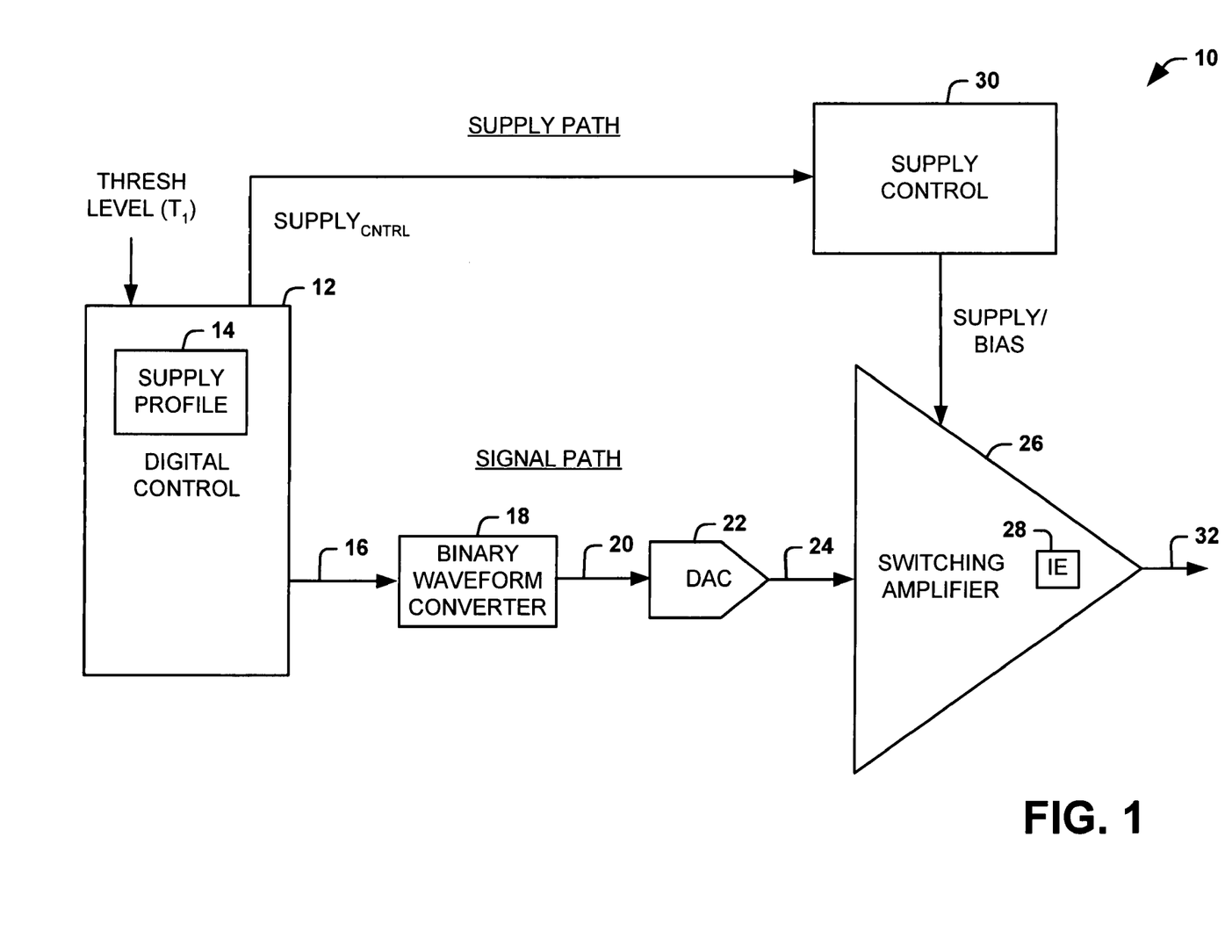
FIG. 1 illustrates a schematic block diagram of an amplification system or architecture in accordance with an aspect of the present invention.

FIG. 1 illustrates an amplification system or architecture 10 in accordance with an aspect of the present invention. The amplification system 10 switches operation between two or more voltage supply levels in response to a characteristic of an input signal relative to one or more threshold levels (e.g., envelope amplitude level, digital count representation of signal level, power amplifier power level). For example, a threshold level $T_1$ can be a selected envelope amplitude level or digital count corresponding to the envelope amplitude level $T_1$. The amplification system 10 can then operate at a first supply level for envelope amplitude levels above the threshold level and at a second supply level for envelope amplitude levels below the threshold level. The threshold level $T_1$ can be one or more fixed, selectable or programmable characteristics (e.g., envelope amplitude level) associated with the input signal.

Although, the digital control device 12 is illustrated as receiving a single threshold level $T_1$, it is to be appreciated that one or more threshold levels can be preprogrammed, programmable, or based on knowledge associated with changes in characteristics associated with the input signal. Additionally, the one or more threshold levels can be fixed or variable.

It is to be appreciated that the threshold level of the amplification system 10 can be one or more characteristics associated with the input signal based on a desired efficiency, linearity, distortion and acceptable out-of-band (OOB) emissions of the amplification system 10. Additionally, the threshold level can be affected by one or more characteristics associated with amplification system fabrication technology (e.g., Gallium Arsenide (GaAs), Indium Phosphide (InP), Gallium Nitride (GaN), Silicon (Si), Laterally Diffused Metal Oxide Semiconductors (LDMOS)). Many exemplary embodiments of the present invention will be described with respect to the threshold level being a selected envelope amplitude level for illustrative purposes. However, other characteristics associated with the input signal, the power amplifier and/or the fabrication technology can be employed to control the switching of the amplification system 10 between one or more supply levels.

The amplification system 10 includes a digital control device 12, such as an application specific integrated circuit (ASIC), field programmable gate array (FPGA), a digital signal processor (DSP) or a combination of digital hardware and/or software components. The digital control device 12 is coupled to a supply control 20 (e.g., a DC/DC converter) via a supply control signal (SUPPLY$_{CNTRL}$) along a supply path. The supply control 20 provides a supply voltage at a voltage level to the supply and/or bias of the switching amplifier 26.

The digital control device 12 provides one or more n-bit binary words 16 to a binary waveform converter 18 along a signal path. The one or more n-bit binary words 18 represent an input signal that corresponds to a desired analog amplified output signal 32. The input signal can be in a variety of different amplitude and/or phase modulated forms. For example, the signal can be a signal that conforms to WCDMA, multi-carrier GSM, OFDM or other signals having high peak-to-average power ratios (PAR).

The binary waveform converter 18 converts the n-bit binary words 16 into a single bit binary waveform 20 having a square-like shape. The single bit binary waveform 20 is then provided to a digital-to-analog converter (DAC) 22, which transforms the single bit binary waveform 20 into the analog domain. An analog binary waveform 24 is then provided to the switching amplifier 26. The switching amplifier 26 includes inhibiting electronics 28, harmonic termination and/or zoning filters that facilitate the reproduction of the desired amplified output signal 32 within its desired spectrum. The amplitude and phase modulation of the output signal envelope 32 is based on the pulse width modulation associated with the analog binary waveform 24.

The digital control device 12 determines the voltage level associated with the supply and/or bias voltage to the switching amplifier 26 based on the threshold level $T_1$ and at least one characteristic associated with the input signal. The digital control device 12 examines the at least one characteristic associated with the input signal by analyzing, for example, an input buffer (not shown) prior to transmission of the input signal from the digital control device 12 to the binary waveform converter 18. The digital control device 12 then builds a supply voltage level profile 14 based on anticipated characteristic changes associated with the input signal. The digital control device 12 informs the supply control 30 of a desired supply voltage based on the supply voltage level profile 14. The supply voltage level profile 14 can define toggling between two levels, for example, one voltage supply level for peak signal levels, and one voltage supply for average signal levels. Alternatively, the supply voltage level profile can define a multi-voltage level profile, have a trapezoidal configuration, or be a tracking waveform with adequate headroom to amplify the input signal.

Figure 2:
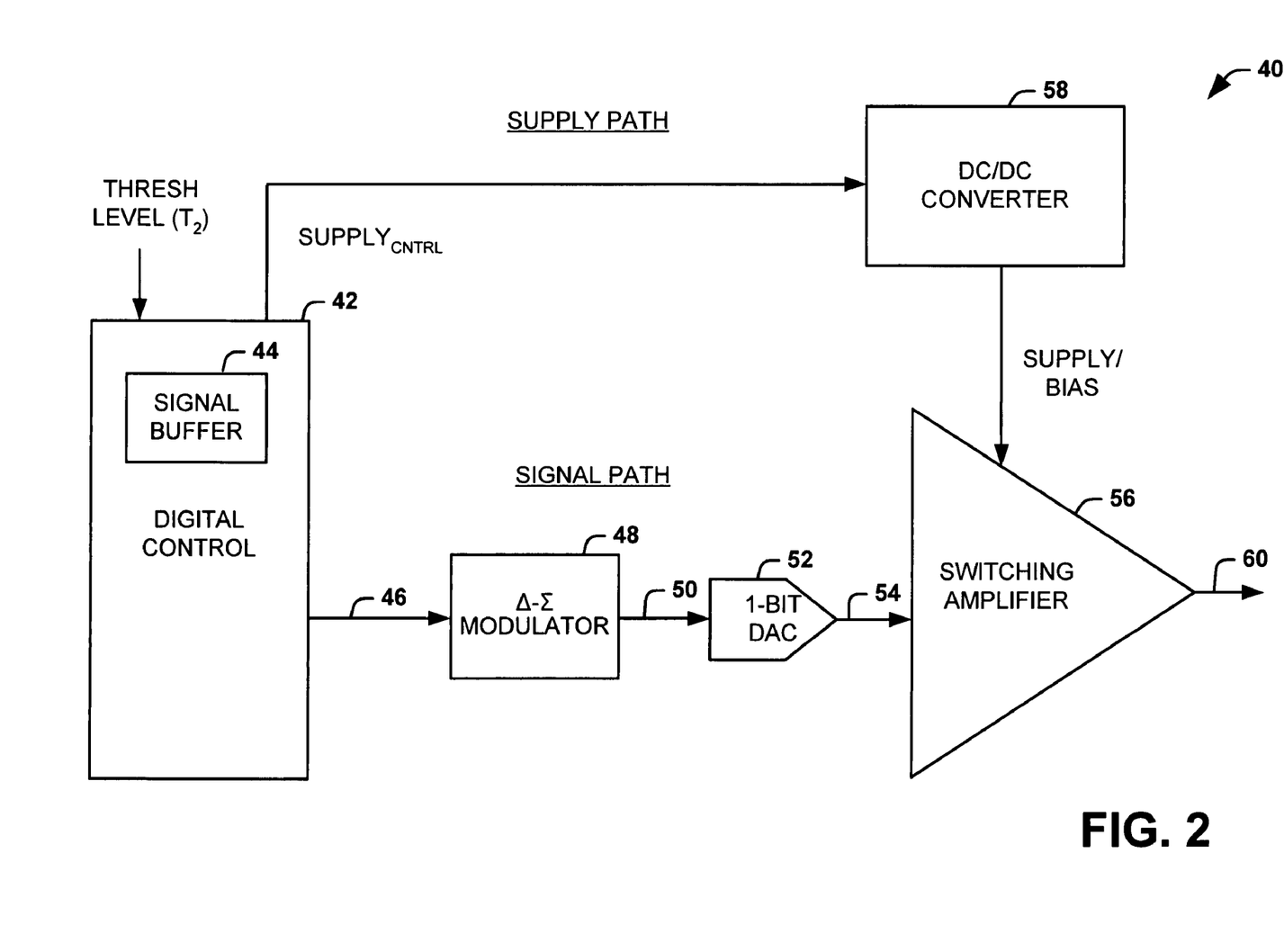
FIG. 2 illustrates a schematic block diagram of an alternate amplification system or architecture in accordance with an aspect of the present invention.

FIG. 2 illustrates an amplification system or architecture 40 in accordance with another aspect of the present invention. The amplification system 40 switches operation between two or more voltage supply levels in response to a characteristic of an input signal relative to one or more threshold levels (e.g., envelope amplitude level, digital count representation of signal level, power amplifier power level). A threshold level $T_2$ can be one or more fixed, selectable or programmable parameters associated with characteristics of the input signal.

The amplification system 40 includes a digital control device 42, such as an application specific integrated circuit (ASIC), field programmable gate array (FPGA), a digital signal processor (DSP) or a combination of digital hardware and/or software components. The digital control device 42 includes a signal buffer 44 in which the input signal is stored prior to transmission through a signal path. The digital control device 42 controls a voltage level supplied by a DC/DC converter 58 via a supply control signal (SUPPLY- $_{CNTRL}$) along a supply path. The DC/DC converter 58 provides a supply voltage that provides a voltage level to the supply and/or bias of the switching amplifier 56.

The digital control device 42 provides one or more n-bit binary words 46 to a delta sigma modulator 48. The one or more n-bit binary words 46 represent an input signal that corresponds to a desired analog amplified output signal 60. The delta sigma modulator 48 converts the n-bit binary words 46 into a single bit binary waveform 50 having a square-like shape. The single bit binary waveform 50 is then provided to a one bit DAC 52, which transforms the single bit binary waveform 50 into the analog domain. An analog binary waveform 54 is then provided to the switching amplifier 56. The switching amplifier 56 includes inhibiting electronics, harmonic termination and/or zoning filters (not shown) that facilitate the reproduction of the desired amplified output signal within its desired spectrum. The amplitude and phase modulation of the output signal 60 is based on the pulse width modulation associated with the analog binary waveform 54. The output signal of the switching amplifier 56 can be a signal that conforms to WCDMA, multi-carrier GSM, OFDM or other signals having similar noise like signatures with high peak-to-average (PAR) ratios.

The digital control device 42 determines the voltage supply level provided by the DC/DC converter 58 associated with the supply and/or bias voltage to the switching amplifier 56. The digital control device 42 determines the voltage supply level based on the threshold level $T_2$ and at least one characteristic associated with the input signal. The digital control device 42 examines the signal buffer 44 prior to transmission of the input signal to determine peak levels associated with the input signal. The digital control device 42 determines when to switch between a high voltage supply level for peak signals and a low voltage supply level for average signals.

The delta sigma modulator 48 is employed to provide a signal similar to a pulse-width modulation signal where the signal varies between two voltage levels at very high rates (higher than the final average RF frequency of the wanted signal).

Figure 3:
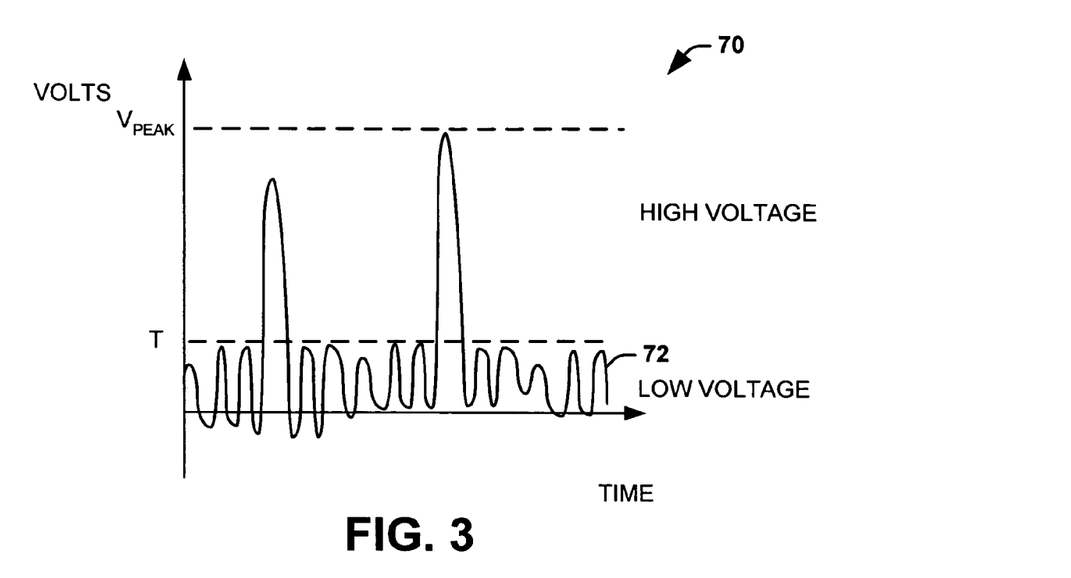
FIG. 3 illustrates a graph of voltage versus time of an exemplary composite input signal prior to being converted to a binary form.

FIG. 3 illustrates a graph 70 of voltage versus time of an exemplary input signal 72 of a switching amplifier prior to being converted to a binary form, in accordance with an aspect of the present invention. The threshold level T is selected to be an envelope amplitude voltage threshold level. At input amplitude voltage levels below T (e.g., average signals), the supply and/or bias voltage is set to a low voltage level. At input amplitude voltage levels above T (e.g., peak signals), the supply and/or bias voltage is set to a high voltage level. Many communications signals, especially those using multiple carriers or CDMA formats, have very high but infrequent peaks. If the full range of signals with high PAR is converted to binary and then amplified by a switching amplifier the output signal will have high efficiency when the signal is in the upper range (e.g., above T) but much lower efficiency for other input signals. The present invention overcomes this limitation, modifying the amplifier supply or bias in accordance with the input signal level.

For high efficiency, the threshold level is selected such that the envelope amplitude voltage level of the signal is below the amplitude threshold voltage level T substantially more often than the signal is above the envelope amplitude threshold voltage level T. Therefore, the amplification system will operate in the low supply voltage level substantially more often than at the high supply voltage level and consume less power and be more efficient.

Figure 4:
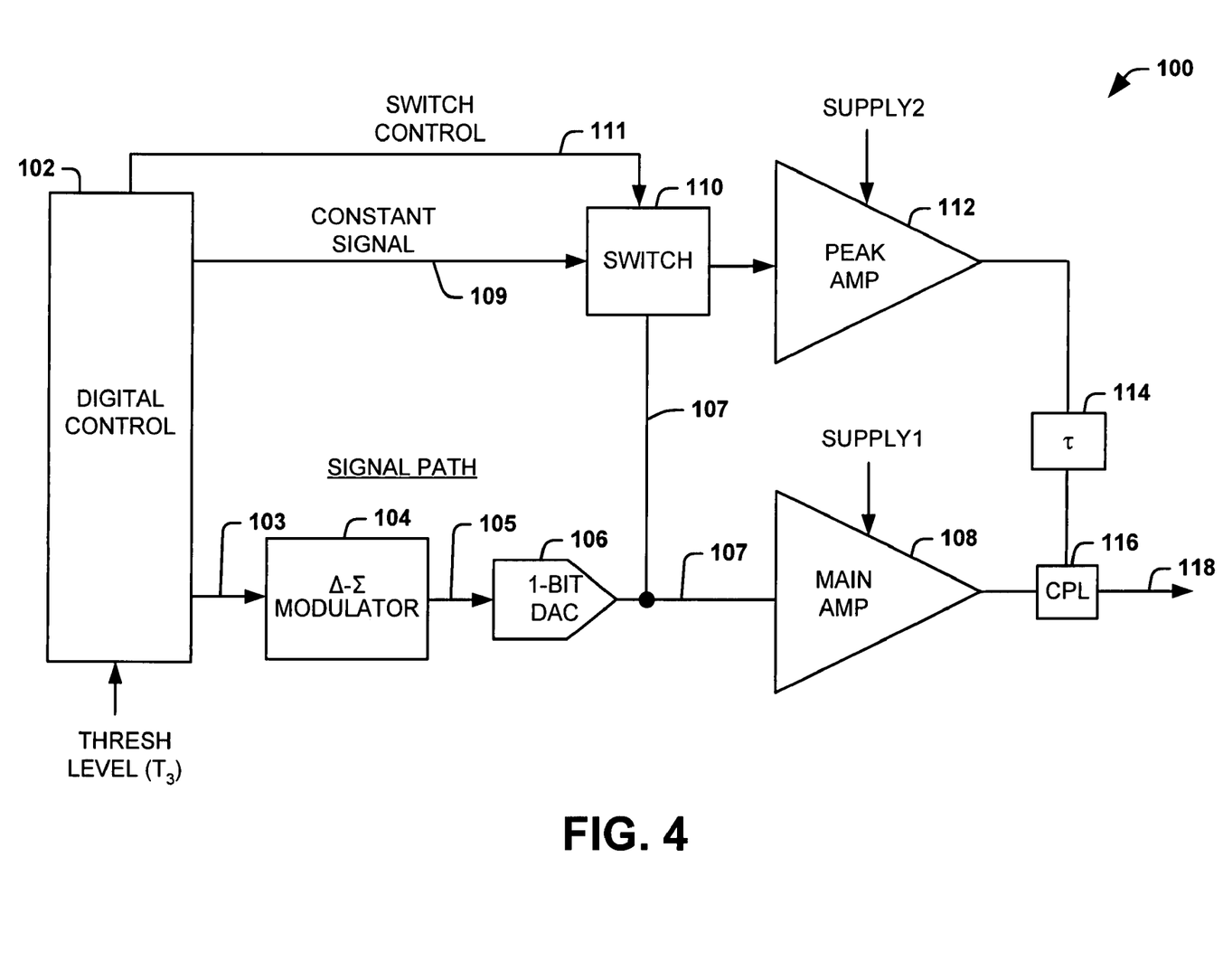
FIG. 4 illustrates a schematic block diagram of an amplification system that employs a two-amplifier configuration in accordance with an aspect of the present invention.

FIG. 4 illustrates an amplification system 100 that employs a two amplifier configuration (e.g., similar to a Doherty amplifier configuration) in accordance with an aspect of the present invention. The amplification system 100 switches operation between a dual amplifier mode, and a single amplifier mode based on an envelope input signal amplitude level relative to a threshold level $T_3$. The amplification system 100 includes a main amplifier 108 and a peak amplifier 112. The main amplifier 108 operates during average signal levels that are below the threshold level $T_3$ and both the main amplifier 108 and the peak amplifier 112 operate during peak signal levels that are above the threshold level $T_3$. As shown, the peak amplifier 112 and the main amplifier 108 are switching amplifiers that amplify in response to a square wave like signal. The main amplifier 108 has a first voltage supply or bias (SUPPLY1), while the peak amplifier 112 has a second voltage supply or bias (SUPPLY2). The voltage level of the first voltage supply (SUPPLY1) and the second voltage supply (SUPPLY2) can be the same or different. It is to be appreciated that a different configuration can be employed if using a linear amplifier as the main amplifier 108. In the latter case the input to the main amplifier would not require conversion to a binary format.

The amplification system 100 includes a digital control device 102. The digital control device 102 provides an input signal to a delta sigma modulator 104 along a signal path, provides a constant signal 109 to a switch device 110, and a switch control signal 111 to control the state of the switch device 110. The digital control device 102 provides one or more n-bit binary words 103 to a delta sigma modulator 104. The one or more n-bit binary words 103 represent an input signal that corresponds to a desired analog amplified output signal 118. The delta sigma modulator 104 converts the n-bit binary words 105 into a single bit binary waveform 105 having a square-like shape. The single bit binary waveform 105 is then provided to a one bit DAC 106, which transforms the single bit binary waveform 105 into the analog domain. An analog binary waveform 107 is provided to the main amplifier 108. The analog binary waveform 107 is also provided to the switch device 110.

The digital control device 102 analyzes an input buffer (not shown) prior to transmission of the input signal to determine peak levels associated with the input signal. The digital control device 102 then determines when to switch the state of the switch device 110 via the switch control signal 111 based on peak signal levels and average signal levels of the input signal. For average signal levels, the zero-like input (e.g., constant signal) signal 109 is provided to the input of the peak amplifier 112 through the switch device 110. Since the peak amplifier 112 responds to an oscillating signal above a quiescent value of the peak amplifier 112, the peak amplifier 112 remains in an "OFF" state and does not consume power. Alternatively, a control mechanism could set the supply level of the peak amplifier to a very low level, effectively turning it "OFF", thus eliminating the need for switch 110, switch control signal 111 and zero like signal 109. For peak signal levels, the analog binary signal 107 is provided to the peak amplifier input through the switch device 110 and to the main amplifier input.

The outputs of the main amplifier 108 and the peak amplifier 112 are coupled together via a transmission line 114 and coupler 116. The output 118 of the amplification system 100 is a reconstructed amplified representation of the final composite signal, with contributions from both the main amplifier 108 and the peak amplifier 112. Alternatively, for peak signal levels, a zero-like input signal can be transmitted to the main amplifier and/or its supply level can be set to a very low level effectively turning it "OFF", thus eliminating the need for signal switching between the main amplifier 108 and the peak amplifier 108.

It is to be appreciated that the threshold level $T_3$ can be selected to achieve a desired efficiency, linearity and amplification system cost. For signals having substantially high peak to average ratios, the signal is provided to the main amplifier 108 substantially more often than the peak amplifier 112. Therefore, the amplification system can operate more efficiently than typical amplification systems employing signals with high peak-to-average ratios. The amplification systems illustrated in FIGS. 1,2 and 4 minimize the complexity of the circuitry necessary to amplify a given input signal by performing many of the functions that create variables in the amplification system in the digital domain. Additionally, the operation of the amplification system can be further improved by employing linearization techniques in the digital domain.

Figure 5:
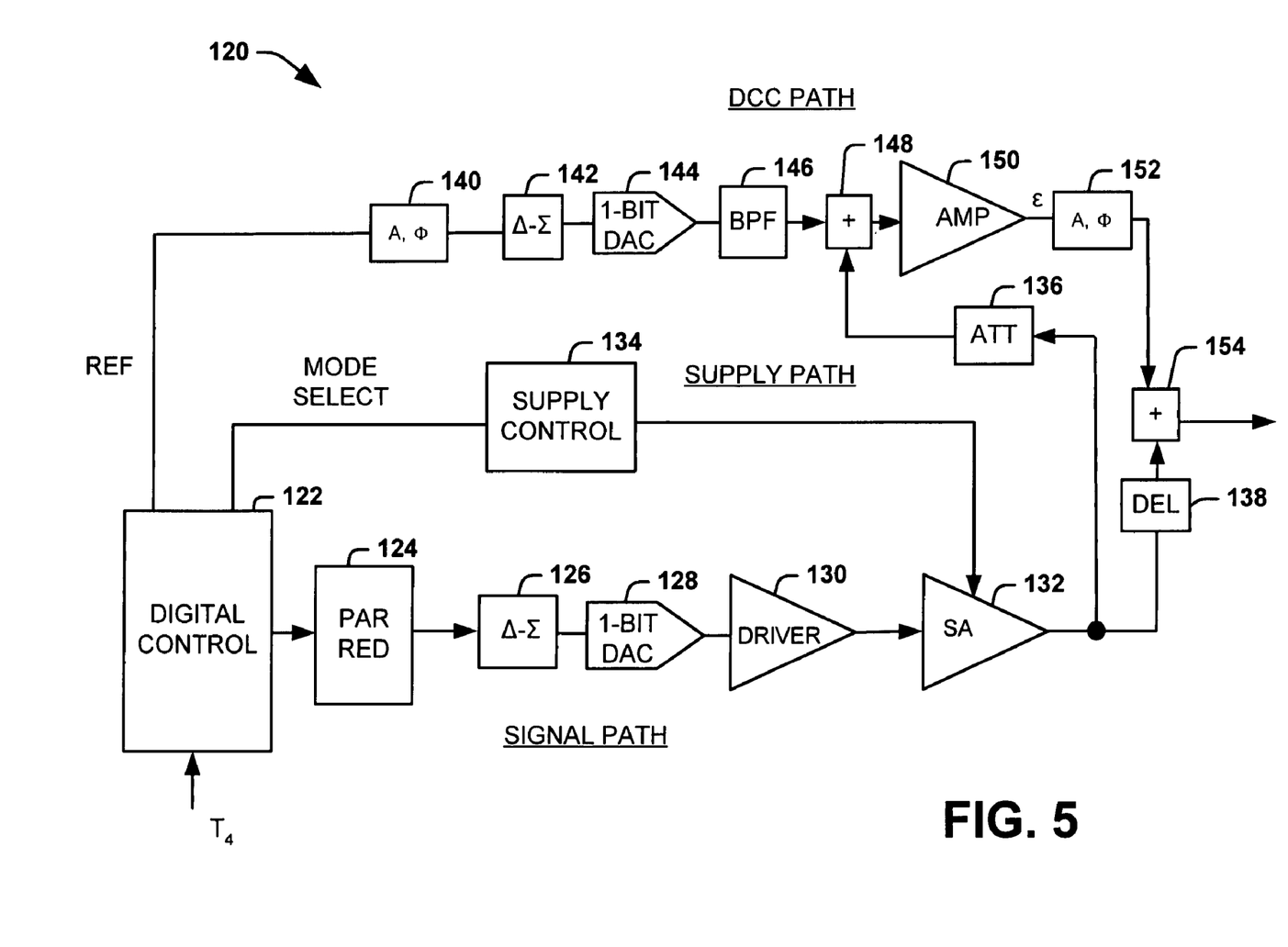
FIG. 5 illustrates a schematic block diagram of an amplification system that employs a linearization technique in accordance with an aspect of the present invention.

FIG. 5 illustrates an amplification system 120 employing a linearization technique in accordance with an aspect of the present invention. The linearization technique is referred to as digital cross-cancellation. The digital cross-cancellation technique provides a digital reference of the wanted signal to a separate DAC generating a "clean" version of the wanted signal. The clean version of the wanted signal is inverted and combined with a portion of the output signal from the power amplifier to determine the unwanted portion of the output signal. The unwanted portion of the input signal is distortion and undesirable out-of band (OOB) emissions. The unwanted portion of the input signal is then inverted and combined with the output signal to cancel the unwanted portion from the output signal. It has traditionally been difficult to linearize switching amplification systems since their input signal is a binary waveform and the output signal is a modulated analog waveform. Feedforward, feedback and predistortion techniques do not readily apply to switching amplification systems. However, the present invention provides for generation of a clean reference signal or an inverted version of a clean reference signal in the digital domain.

A digital control device 122 generates an input signal along a signal path, for example, an n-bit word representing an amplitude and phase modulated signal. The digital control device 122 determines the operating mode (e.g., high supply voltage level, low supply voltage level) of the amplification system 120 based on a characteristic of the input signal, such as envelope amplitude, with respect to a threshold level $T_4$. The digital control device 122 provides a mode select signal along a supply path to a supply control device 134, which controls the supply voltage and/or bias voltage to a switching amplifier 132. The supply voltage determines the supply level and/or bias level of the switching amplifier 132.

The digital control device provides the input signal to a PAR reduction component 124. The PAR reduction component 124 can reduce peak signal levels through clipping or inclusion of the addition of signals. The PAR reduction component 124 then passes the PAR reduced n-bit input signal to a delta sigma modulator 126. The delta sigma modulator 126 converts the n-bit binary words into a single bit binary waveform having a square-like shape. The single bit binary waveform is then provided to a one bit DAC 128, which transforms the single bit binary waveform into the analog domain. The delta-sigma modulator 126 and the DAC 128 cooperate to perform a digital-to-analog conversion directly to radio transmission frequencies. The analog binary waveform is then provided to a driver or pre-amplifier 130, which provides additional gain to the analog binary waveform. The driver 130 provides the analog binary signal to the switching amplifier 132.

The supply voltage level provided by the supply control 134 toggles between a high voltage level and a low voltage level to dynamically adjust the supply level and/or bias of the switching amplifier 132 in response to peak level signals associated with the input signal. The amplitude and phase modulation of the output signal of the amplification system 120 is based on the pulse width modulation associated with the analog binary waveform. The output signal of the amplification system 120 can be a signal that conforms to WCDMA, multi-carrier GSM, OFDM or other signals having similar noise like signatures with high peak-to-average (PAR) ratios.

The digital control device 122 provides a reference signal along a DCC path to a digital inverter 140. The reference signal is a reference version (REF) of the input signal corresponding to the desired amplified output signal prior to any modifications. Alternatively, the digital inverter 140 can be eliminated and the inverted version of the clean reference signal can be provided by the digital control device 122. The inverted clean reference signal is transmitted to a delta-sigma modulator 142. The delta sigma modulator 142 is coupled to a DAC 144 and a band pass filter 146. The delta-sigma modulator 142, the DAC 144 and the band pass filter 146 cooperate to perform a digital-to-analog conversion directly to radio transmission frequencies of the inverted version of the clean reference signal (REF).

A small portion of the output of the switch amplifier 132 is split off by a coupler through an attenuator 136 and summed with the inverted clean reference signal through a summer 148. The output of the summer 148 is signal distortion and OOB emissions. The output of the summer 148 is amplified by an error amplifier 150 to produce an error signal ($\epsilon$). The error signal is inverted through an inverter 152 to provide an inverted error signal. The inverted error signal is recombined with a delayed version (via delay device 138) of the output of the switching amplifier 132 through a summer 154 to remove OOB emissions and reduce distortion levels.

The digital cross-cancellation technique in accordance with an aspect of the present invention can supply correction for amplifier distortions and it can correct spectral leakage into adjacent channels that occur. Additionally, since a digital clean reference signal is employed to determine the desired correction at the output, any modification of the signal can be corrected at the final output stage without the need for additional correction information during the amplification process.

Figure 6:
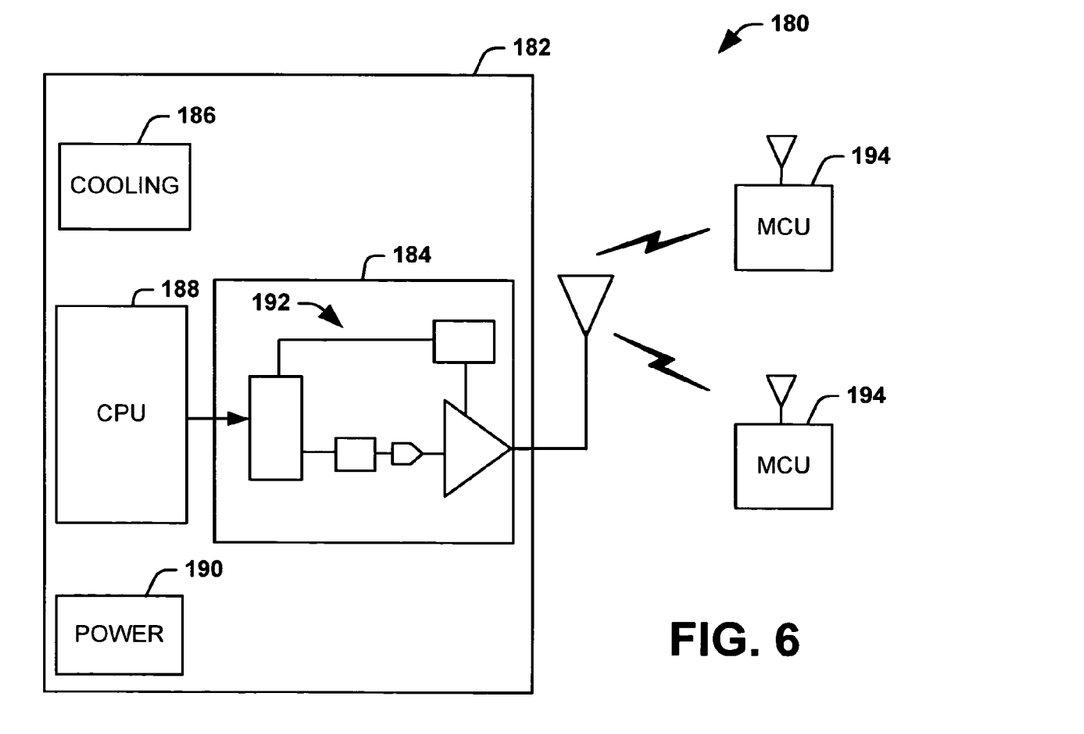
FIG. 6 illustrates a block diagram of a communication system in accordance with an aspect of the present invention.

The amplification system of the present invention can be employed in a number of applications. The amplification system can be employed in wireless transmitter applications for base stations (e.g., satellites, cellular), handsets, and other mobile communication devices. FIG. 6 illustrates a communication system 180 having a base station 182 with a transmitter 184 employing a switching amplifier architecture 192 in accordance with an aspect of the present invention. The switching amplifier architecture 192 operates at a low voltage level when envelope amplitudes of transmission signals are below a threshold level and at a high voltage level when envelope amplitudes of transmission signals are above a threshold level.

A central processing unit (CPU) 188 is coupled to the switching amplifier architecture system 192. The CPU 188 can facilitate control and threshold selection of the switching amplifier architecture system 192. For example, the CPU 188 can generate the type of signal (e.g., WCDMA, GSM, OFDM) to be transmitted and select the threshold level in which the switching amplifier architecture system 192 switches between high and low voltage supply levels. The base station 182 communicates to a group of mobile communication unit (MCUs) comprised of MCUs 194. The MCUs 194 are for illustrative purposes and it should be appreciated that the group of MCUs can include a greater number of MCUs based on the number of carriers in the output signal.

The base station 182 also includes cooling devices 186 and power devices 190. The power devices 190 can include AC-DC power converters, fuses, battery backup devices that protect the base station 182 from power loss failures. The power devices 190 and cooling devices 186 can be substantially reduced in size and cost compared to conventional devices since the switching amplifier architecture 192 of the present invention operates with substantially more efficiency than conventional amplification systems. Although the base station 182 is illustrated as having a single transmitter 184, the base station 182 can have a plurality of transmitters communicating to different respective groups of MCUs over similar communication signal standards or different communication signal standards. Additionally, the MCUs 194 can also include transmitters with switching amplifier architecture systems 192 that operate in a low voltage supply level and a high voltage supply level mode similar to that described for the transmitter 184.

Figure 7:
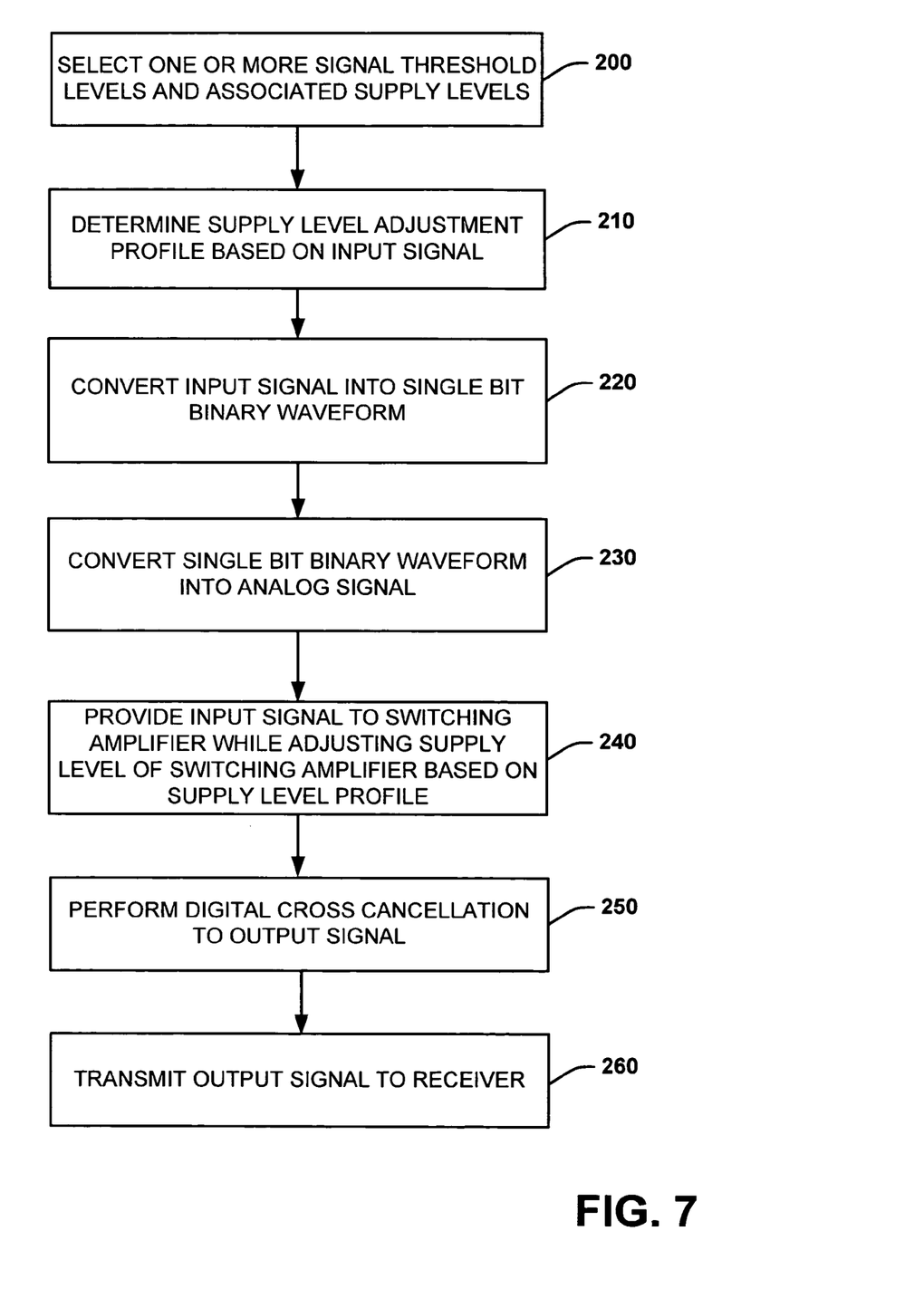
FIG. 7 illustrates a methodology for operating a switching amplification system in accordance with an aspect of the present invention.

In view of the foregoing structural and functional features described above, a methodology in accordance with various aspects of the present invention will be better appreciated with reference to FIG. 7. While, for purposes of simplicity of explanation, the methodology of FIG. 7 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

FIG. 7 illustrates a methodology for operating a switching amplification system in accordance with an aspect of the present invention. The methodology begins at 300 where one or more signal threshold levels and associated supply levels are selected. The threshold levels can be, for example, envelope amplitude levels in which a switching amplifier operates at one or more voltage supply levels for a corresponding envelope amplitude level range to modify voltage supply and/or bias associated with the switching amplification system to facilitate efficiency. At 210, a supply level adjustment profile is determined based on the input signal. The methodology then proceeds to 220. At 220, an input signal is converted into a single bit binary waveform. Peak signal levels of the input signal can be reduced through clipping or inclusion of the addition of signals prior to converting into the single bit binary waveform. The input signal can be an n-bit word that is delta sigma modulated into a single bit binary waveform. The single bit binary waveform is then converted from the digital to the analog domain at 230.

At 240, the input signal is provide to the switching amplifier while the supply level and/or bias of the switching amplifier is dynamically adjusted based on the supply level adjustment profile. For example, the supply level adjustment profile can change from a low voltage level for average level signals and a high voltage level for peak level signals. Alternatively, the supply level adjustment profile can be based on multi-supply levels, have a trapezoidal configuration or be a tracking waveform with adequate headroom to amplify the input signal. At 250, digital cross cancellation is performed on the output signal of the switching amplifier to linearize the output signal. At 260, the output signal is transmitted to a receiver. The output signal can be in a number of different single carrier or multi-carrier amplitude and phase modulated signal formats (e.g., WCDMA, GSM, OFDM).

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. An amplifier architecture comprising:
    a switching amplifier operative to amplify an input signal;
    a supply control device that varies a supply voltage of the switching amplifier between a plurality of fixed voltage supply levels based on a characteristic of the input signal relative to a threshold level; and
    a binary waveform converter that converts the input signal into a binary waveform for inputting into the switching amplifier.

2. The amplifier architecture of claim 1, further comprising a digital-to-analog converter (DAC) that converts the binary waveform into an analog waveform for amplifying by the switching amplifier.

3. The amplifier architecture of claim 2, the DAC comprising a one-bit DAC.

4. The amplifier architecture of claim 1, the input signal being an n-bit word that represents a phase and/or amplitude modulated signal and the threshold level being an envelope amplitude level associated with the input signal representation.

5. The amplifier architecture of claim 4, the switching amplifier being a peak amplifier configured in combination with a main amplifier, the peak amplifier receiving the binary waveform for input signals above the threshold and the peak amplifier effectively being turned "OFF" for input signals below the threshold.

6. The amplifier architecture of claim 5, the main amplifier receiving the binary waveform for both peak and average level signals.

7. The amplifier architecture of claim 5, the main amplifier effectively being turned "OFF" for input signal levels above the threshold by one of providing a zero like signal to the input of the main amplifier and setting the supply level to a very low level effectively turning it "OFF" for input signal levels above the threshold.

8. The amplifier architecture of claim 5, the peak amplifier effectively being turned "OFF" for input signal levels below the threshold by one of providing a zero like signal to the input of the peak amplifier and setting the supply level to a very low level effectively turning it "OFF" for input signal levels below the threshold.

9. The amplifier architecture of claim 1, further comprising a digital control device that analyzes the input signal and builds a fixed voltage supply level adjustment profile for dynamically modifying the supply voltage to the switching amplifier in response to changes in the characteristic of the input signal relative to the threshold level.

10. The amplifier architecture of claim 1, the binary waveform converter comprising a delta sigma modulator.

11. The amplifier architecture of claim 1, further comprising a digital control device that generates a reference signal corresponding to a desired output signal of the switching amplifier, the clean reference signal being combined with a portion of an output signal from the switching amplifier to determine an error signal, the error signal being inverted and combined with a delayed version of the output signal of the switching amplifier to generate a final output signal.

12. The amplifier architecture of claim 1, the supply control device comprising a DC/DC converter.

13. A transmitter comprising the amplifier architecture of claim 1.

14. A base station comprising the transmitter of claim 13.

15. A system for amplifying a signal comprising:
a binary waveform converter that converts an n-bit word representing an input signal into a binary waveform;
digital-to-analog converter (DAC) that converts the binary waveform into an analog binary waveform;
a switching amplifier operative to amplify the analog binary waveform;
a main amplifier operative to amplify the analog binary waveform, the main amplifier and the switching amplifier being configured such that the switching amplifier operates as a peak amplifier; and
a digital control device that modifies a configuration of the system in response to changes in at least one characteristic associated with the input signal.

16. The system of claim 15, the modification of the configuration comprising adjusting the supply and/or bias of the switching amplifier.

17. The system of claim 15, the main amplifier comprising a linear amplifier.

18. The system of claim 15, the modification of the configuration comprising switching the analog binary waveform to the input of the switching amplifier for peak level signals and providing a zero-like signal to the input of the switching amplifier for average level signals.

19. The system of claim 15, the switching amplifier effectively being turned "OFF" for average level signals by setting the supply level to a low level effectively turning it "OFF" for average level signals.

20. The system of claim 15, the main amplifier effectively being turned "OFF" for peak level signals by one of providing a zero like signal to the input of the main amplifier and setting the supply level to a low level effectively turning it "OFF" for peak level signals.

21. The system of claim 15, the DAC comprising a one-bit DAC and the binary waveform converter comprising a delta sigma modulator.

22. The system of claim 15, the input signal being a representation of a phase and/or amplitude modulated signal and the characteristic being an envelope amplitude level associated with the input signal representation.

23. The system of claim 15, the digital control device analyzes the input signal and builds a voltage supply level profile for dynamically adjusting the supply and/or bias of the switching amplifier in response to changes in the at least one characteristic associated with the input signal.

24. An amplification system comprising:
means for converting an n-bit binary word representing a phase and amplitude modulated input signal into a binary waveform;
means for amplifying the binary waveform to reproduce the phase and amplitude modulated input signal; and
means for modifying the supply and/or bias of the means for amplifying between a plurality of fixed voltage supply levels in response to changes in a characteristic of the input signal.

25. The system of claim 24, further comprising means for converting the binary waveform into an analog binary waveform prior to amplification.

26. The system of claim 24, further comprising means for building a fixed voltage supply level adjustment profile for dynamically modifying the supply voltage to the switching amplifier in response to changes in the characteristic of the input signal relative to a threshold level.

27. The system of claim 24, further comprising means for linearizing the output signal of the means for amplifying.

28. The system of claim 27, the means for linearizing comprising a digital cross-cancellation component that generates a separate reference signal corresponding to a desired output signal, the clean separate signal being combined with a portion of an output signal from the means for amplifying to determine an error signal, the error signal being inverted and combined with a delayed version of the output signal of the means for amplifying to generate a final output signal.

29. The system of claim 28, further comprising means for reducing peaks associated with the n-bit binary word.

30. A method of amplifying an input signal with a switching amplifier, the method comprising:
determining a fixed voltage supply level adjustment profile based on changes in at least one characteristic associated with an input signal;
converting a digital input signal into a single bit binary waveform;
converting the single bit binary waveform into an analog binary waveform; and
amplifying the analog binary waveform with a switching amplifier into an amplified output signal while concurrently adjusting a supply and/or bias level of the switching amplifier between a plurality of fixed voltage supply levels based on the fixed voltage supply level adjustment profile.

31. The method of claim 30, further comprising transmitting the amplified input signal to at least one receiver.

32. The method of claim 30, the converting a digital input signal into a single bit binary waveform comprising delta sigma modulating the digital input signal.

33. The amplifier architecture of claim 1, the switching amplifier comprising at least one of inhibiting electronics, harmonic termination and zoning filers that facilitate the reproduction of a desired amplified output signal within a desired spectrum.

* * * * *